ELECTRICAL SEMICONDUCTOR DEVICE

Filed May 21, 1963 2 Sheets-Sheet 1

INVENTORS.
HEINZ RÖSSLE
BY BERNHARD SCHWARZ
Percy P. Lantzy
ATTORNEY

Oct. 18, 1966 H. ROSSLE ETAL 3,280,390

ELECTRICAL SEMICONDUCTOR DEVICE

Filed May 21, 1963 2 Sheets-Sheet 2

INVENTORS
HEINZ RÖSSLE
BERNHARD SCHWARZ

BY

ATTORNEY

United States Patent Office 3,280,390

Patented Oct. 18, 1966

3,280,390

ELECTRICAL SEMICONDUCTOR DEVICE

Heinz Rossle, Schnaittach-Markt, and Bernhard Schwarz, Nurnberg, Germany, assignors to International Standard Electric Corporation, New York, N.Y., a corporation of Delaware Filed May 21, 1963, Ser. No. 281,873
Claims priority, application Germany, June 9, 1962, St 19,343
5 Claims. (Cl. 317—234)

This invention relates to an electrical semiconductor device and particularly to an improved power rectifier formed of a semiconductor such as germanium, silicon, an intermetallic compound or similar material.

In the past, semiconductor devices have been mounted in sealed casings which also serve to dispose of the heat emanating from operation. The known enclosures for semiconductors, however, are complicated in design and are difficult to place in close relation, to permit connection in parallel or series arrangements. Generally these devices require large areas for attachment of cooling devices and fins to the enclosures and chassis for dissipation of the heat.

It is therefore the primary object of the invention to provide an improved semiconductor power rectifier of a simple, compact and more efficient form.

The invention uses a stacked arrangement, in which the individual rectifier plates are held together under pressure by means of a bolt, frame or the like, to accommodate a plurality of electrical semiconductor devices. The semiconductor element is positioned within a solid metal contacting ring or spacer. Due to the high heat capacity of the metal ring, sudden large quantities of heat at peak loads can be absorbed without reaching a temperature that would endanger the semiconductor. The semiconductor device is preferably positioned in a recess within the metallic ring so that the heat can dissipate to all sides and in all directions. The hole with the semiconductor device can also be enclosed with an insulating cover containing a bushing, to provide further protection against unusually excessive heating.

Instead of solid metal rings, other suitable shapes may be used to support the semiconductor device, such as hexagonal or square, provided that stacking can be accomplished. The semiconductor device such as a silicon rectifier is preferably accommodated in the peripheral surface of the annular support or in one front side. The hole or recess can be shaped as desired. In some cases it is suitable to utilize an annular slot. The solid metal ring forms a direct electrical contact for one semiconductor electrode, while the other connection consists of an insulated wire leading out of the hole. It is also possible to form the second connection by a disk of similar shape and size as that of the metal ring, insulated from the latter but firmly secured thereto. With this structure, elements can be stacked on a bolt or in a suitable insulating frame or enclosure and may be connected in a series or parallel relationship.

Figure 1:
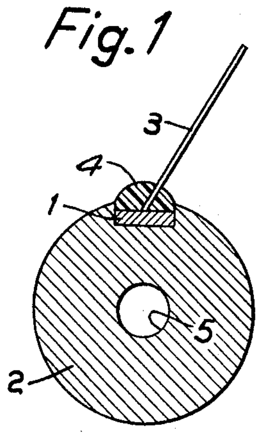
Figure 1A:
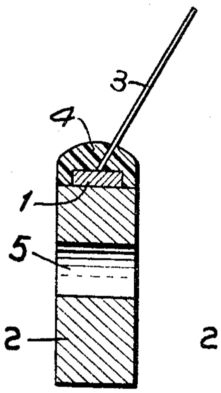
Figure 2:
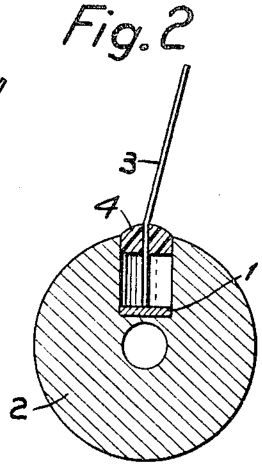
Figure 2A:
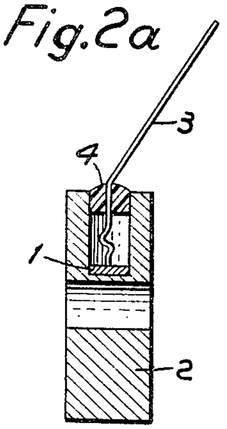
Figure 3:
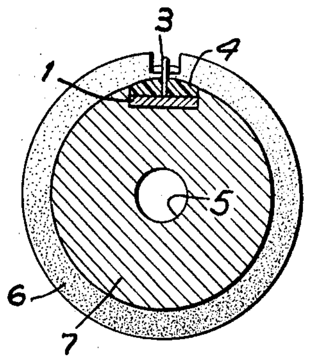
Figure 3A:
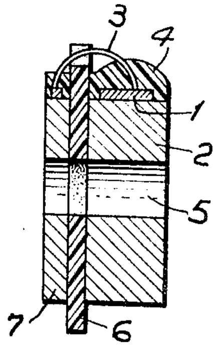
Figure 6:
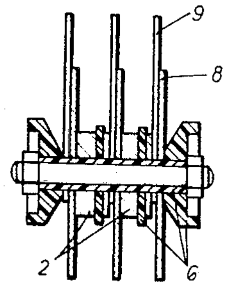
Figure 7:
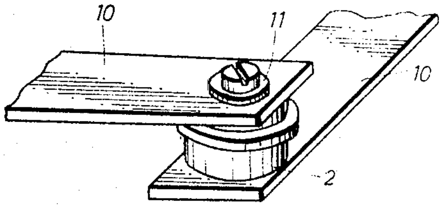
Figure 8:
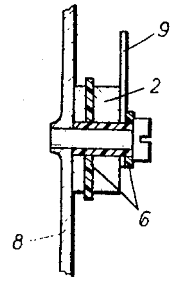

The details of the invention will be more fully understood and other objects and advantages will become apparent in the following description and accompanying drawings, wherein:

FIGS. 1 to 5*a* represent various embodiments of the invention as seen from the top and in cross-section. FIG. 6 shows a cross-sectional arrangement in which several elements of the type shown in FIG. 3, are stacked. FIG. 7 shows the arrangement of a rectifier device between conductor bars and FIG. 8 shows another arrangement in cross-section, in which an additional cooling plate is used.

In the arrangement according to FIG. 1 the peripheral surface of the solid metal ring 2 is provided with a recess or slot in which the semiconductor device 1 is arranged so that one electrode is securely connected in contact with the metal ring 2. The second connection is formed by the lead wire 3. The recess is filled with suitable insulating layer 4, such as epoxy resin, to protect the semiconductor device against mechanical damage. If several such semiconductor devices are connected in parallel, the metal rings 2 can be in direct electrical contact. In a series-connection, insulating disks will be inserted between the metal rings 2 set one above the other, and the lead 3 of each semiconductor device electrically connected with the metallic body 2 of the succeeding semiconductor device. This can be achieved by soldering, welding, or screwing the lead wire 3 onto the outside of the adjacent metal ring bearing the other semiconductor device. The lead wire 3 may also be connected with a perforated metal disk which electrically contacts the adjacent metal ring when assembled.

FIG. 2 shows an arrangement essentially similar to the one of FIG. 1 with the only difference being that the semiconductor 1 is secured on the bottom of a deep drill-hole in the metal ring 2 and that this hole is enclosed by suitable means, such as glass-pearl insulation. An electrical bushing or connector on the outer surface of the metal ring can be soldered into the drillhole opening for connection to the second lead 3 which passes through the cap.

FIG. 3 shows another arrangement particularly suitable for stacked rectifiers, in which several individual elements are mounted on a bolt and connected in series. The structure is the same as shown in FIG. 1, but an insulating disk 6 is mechanically secured between the metal ring 2 and a metal layer 7 on the other side. This latter metal layer 7 is electrically connected with one electrode of the rectifier element 1 via the lead 3, resulting in a series connection when stacking several such elements. The lead 3 either extends around the insulating disk 6 or protrudes through a hole or recess of said disk. This disk not only electrically separates the metal ring 2 from the metallic layer 7, but also enlarges the leakage path between both terminals to prevent arcing. The metallic layer 7 on the insulating disk may, for example, be a solid metal disk of the same material as the metal ring 2, or of a die-cast or otherwise formed metal layer or foil.

Figure 4:
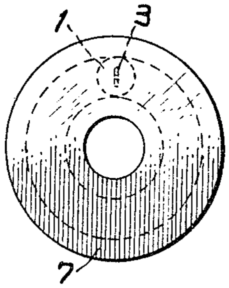
Figure 4A:
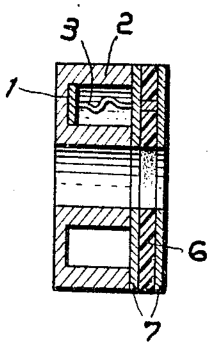

FIG. 4 shows another arrangement which is also useful as an element for serially stacked elements. The solid metal ring has an annular recess or slot and the semiconductor device 1 is inserted into said recess from a front side. Several radially positioned rectifiers may thus be accommodated. On the side of metal ring 2 having the annular recess, a thin metallic layer 7 and an insulating disk or layer 6 are provided, followed by another metallic layer 7. The insulating layer or disk 6 has a drillhole through which the second lead 3 for the semiconductor element protrudes. The lead 3 is electrically connected to the topmost metallic layer 7.

Figure 5:
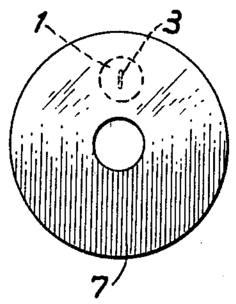
Figure 5A:
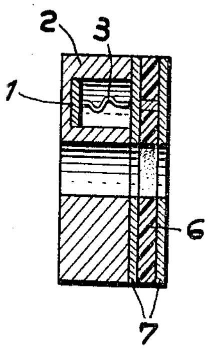

The device shown in FIG. 5 corresponds to that of FIG. 4, except that instead of the annular recess, a drill-hole is provided on the front side, into which the semiconductor device 1 is inserted and secured. This configuration has the advantage of the higher heat capacity of the surrounding metal ring or base plate compared with that of FIG. 4.

The various forms of the invention shown in FIGS. 3, 4 and 5 may be stacked in series in a simple way as elements on an insulated bolt, as shown in cross-section in FIG. 6. Metal plates 8 for better heat dissipation and electrical connecting lugs 9 may be inserted between the individual elements. In another example shown in FIG.

7, the rectifier element is fastened with a screw between two conducting rails or bars 10, which simultaneously dissipate heat. A plurality of adjacent elements can thus be mounted with minimum space requirements. Single rectifiers may also be equipped with a cooling plate 8 and electrical lugs 9 as shown in cross-section in FIG. 8. The solid metal ring should be supported on a material with proper electrical and thermal conductivity such as copper, silver, or aluminum. The metallic layers 7 such as those of FIGS. 4 and 5 may be metal-plated layers, if ceramics are used for insulating disk 6, and the layer in contact with the solid metal ring 2 may be a suitable compound.

The semiconductor materials are preferably of germanium or silicon crystal of a well known structure having zones or layers of opposite conductivity type material which form the separate electrodes of the usual rectifier and wherein the p-n junction is produced under a protective oxide layer. This provides protection from ambient conditions such as humidity which adversely affect operation, and eliminates the requirement for hermetically sealed enclosures. In addition, the rectifier electrodes may be arranged to conduct in any desired direction with suitably applied direct voltages.

The present invention thus provides a novel compact simplified semi-conductor device of improved power handling capability and efficiency. While several embodiments have been illustrated, it is apparent that the invention is not limited to the exact forms or uses shown and that many other variations may be made in the design and configuration without departing from the scope of the invention as set forth in the appended claims.

What is claimed is:

1. A semiconductor mounting structure comprising:
a metal disk having a hole therethrough and a recess in a given surface thereof;
a semiconductor element having at least two electrodes positioned in said recess, one of said electrodes being electrically connected to said metal disk;
an insulating layer disposed on said given surface, said layer having a hole therethrough in alignment with the hole through said metal disk, and another hole therethrough communicating with said recess;
a metal layer disposed on said insulating layer, said metal layer having a hole therethrough in alignment with the holes through said metal disk and said insulating layer; and
an electrical connection between the other of said electrodes and said metal layer.

2. A semiconductor mounting structure according to claim 1, further comprising an insulated mounting bolt through said aligned holes.

3. A semiconductor mounting structure comprising:
a metal disk having a recess therein;
a semiconductor element having at least two electrodes formed of zones of opposite conductivity type semiconductor material positioned within said recess, said semiconductor element having an oxide layer on at least one surface thereof, one of said electrodes being in the form of a layer secured in direct electrical contact with said metal disk;
an insulating disk covering said metal disk and enclosing said element within said recess;
a conductor connected to the other said electrode and passing through said insulating disk;
an outer metallic layer positioned on said insulating disk and connected therethrough to said conductor; and
means for securing said metal disk to a support structure, said securing means including a mounting hole through said disks and outer metallic layer, an insulated bolt positioned in said hole, and a heat conducting support structure, said support engaging said also forming an electrical connection to said metal disk.

4. The device of claim 3 wherein a plurality of series connected semiconductor elements and mounting structures are stacked on said bolt.

5. The device of claim 4 including electrical connecting terminals positioned between adjacent stacked structures.

References Cited by the Examiner

UNITED STATES PATENTS

| | | | |
|---|---|---|---|
| 1,905,525 | 4/1933 | Strobel | 317—234 |
| 2,558,798 | 7/1951 | Thom | 338—256 |
| 2,712,619 | 7/1955 | Zetwo | 317—234 |
| 2,861,227 | 11/1958 | Scherbaum | 317—234 |
| 2,946,935 | 7/1960 | Fin | 317—234 |
| 2,986,679 | 5/1961 | Storsand | 317—234 |
| 3,110,080 | 11/1963 | Boyer et al. | |

FOREIGN PATENTS

| | | |
|---|---|---|
| 61,473 | 11/1954 | France. |
| 883,862 | 12/1961 | Great Britain. |

JOHN W. HUCKERT, *Primary Examiner.*

RICHARD M. WOOD, *Examiner.*

H. T. POWELL, A. M. LESNIAK, *Assistant Examiners.*